(12) United States Patent
Hwang et al.

(10) Patent No.: US 6,590,491 B2
(45) Date of Patent: Jul. 8, 2003

(54) STRUCTURE FOR COMPOSITE MATERIALS OF POSITIVE TEMPERATURE COEFFICIENT THERMISTOR DEVICES AND METHOD OF MAKING THE SAME

(75) Inventors: Ren-Haur Hwang, Taoyuan (TW); Der-Yang Liu, Taoyuan (TW); Chen-Ron Lin, Hsinchu (TW)

(73) Assignee: Protectronics Technology Corporation, Taoyuan (TW)

( * ) Notice: Subject to any disclaimer, the term of this patent is extended or adjusted under 35 U.S.C. 154(b) by 0 days.

(21) Appl. No.: 10/056,459

(22) Filed: Jan. 24, 2002

(65) Prior Publication Data

US 2002/0125983 A1 Sep. 12, 2002

(30) Foreign Application Priority Data

Mar. 7, 2001 (TW) .......................................... 90105217 A

(51) Int. Cl.$^7$ .................................................. H01C 7/10
(52) U.S. Cl. ...................... 338/22 R; 338/312; 338/314
(58) Field of Search .......................... 338/22 R, 22 SD, 338/312, 314

(56) References Cited

U.S. PATENT DOCUMENTS

| | | | |
|---|---|---|---|
| 4,314,230 A | * | 2/1982 | Cardinal et al. ............. 338/314 |
| 4,689,475 A | | 8/1987 | Kleiner et al. .............. 219/553 |
| 4,800,253 A | | 1/1989 | Kleiner et al. .............. 219/553 |
| 4,833,305 A | * | 5/1989 | Mashimo et al. ........... 219/549 |
| 5,068,061 A | * | 11/1991 | Knobel et al. ............. 338/314 |
| 5,247,276 A | * | 9/1993 | Yamazaki ................. 338/22 R |
| 5,518,840 A | * | 5/1996 | Verhoog et al. ............ 429/211 |
| 5,874,855 A | * | 2/1999 | Azuma et al. .............. 327/589 |
| 5,955,936 A | * | 9/1999 | Shaw, Jr. et al. ......... 338/22 R |

* cited by examiner

Primary Examiner—Karl D. Easthom
(74) Attorney, Agent, or Firm—Ladas & Parry

(57) ABSTRACT

The present invention discloses a structure for composite materials of a positive temperature coefficient thermistor and a method of making the same. A carbon black is electroplated onto a surface of the metal electrodes of a metal laminated material to form a continuous porous structure having carbon black. Then a thermal laminating process is used to laminate the metal laminated material and a conductive crystallized polymeric composite material plaque filled with carbon black, to form a fine point between surfaces of the metal electrodes of metal laminated material and the conductive crystallized polymeric composite material plaque filled with carbon black. In the meantime, it can also lower down interfacial resistance by allowing carbon black particles of conductive crystallized polymeric composite material filled with carbon black to fully contact with the surface electroplated layer of the metal electrodes.

10 Claims, 7 Drawing Sheets

STRUCTURE FOR COMPOSITE MATERIALS OF POSITIVE TEMPERATURE COEFFICIENT THERMISTOR DEVICES AND METHOD OF MAKING THE SAME

BACKGROUND OF THE INVENTION (A) Field of the Invention

The present invention relates to a structure for composite materials of a positive temperature coefficient thermistor and a method of making the same, and in particular, to a conductive polymeric composite material having carbon black utilized to a structure for composite materials of a positive temperature coefficient thermistor and a method of making the same.

(B) Description of Related Art

Thermistor devices are already widely used in many fields, such as temperature detection, security control, temperature compensation, and so on. In the past, a thermistor device has mainly utilized ceramic material. However ceramic material needs to be manufactured at high temperatures, in most cases, more than 900° C. Thus the energy consumption is enormous, and the process is very complicated. Later on, a thermistor device utilizing a polymeric substrate is developed. As the manufacturing temperature of a thermistor device employing a polymeric substrate can be lower than 300° C., its manufacturing and molding are easier, the energy consumption is less, the process is easier, and the production cost is lower. Thus its application gets more and more popular as time goes on.

The conductive crystallized polymeric composite material filled with carbon black is under a low resistance status at a room temperature due to its characteristics of the positive temperature coefficient thermistor. When the current flowing though the conductive crystallized polymeric composite material filled with carbon black is too large, and the temperature of the conductive crystallized polymeric composite material filled with carbon black reaches the melting point of polyethylene, volumes of resin in the conductive crystallized polymeric composite material filled with carbon black expand to an extent that makes the conductive stuffing materials in the conductive crystallized polymeric composite material filled with carbon black break down from a continuous status to a discontinuous status. Thus the resistance of the conductive crystallized polymeric composite material filled with carbon black will rise rapidly, and plaques made of conductive crystallized polymeric composite material filled with carbon black will break the current accordingly. So plaques made of conductive crystallized polymeric composite material filled with carbon black can be applied to the multi-layer circuit laminated structure for designing an over-current protection device and a temperature switch device.

However, the interfacial joint strength of the plaques made of the metal foil and conductive crystallized polymeric composite material filled with carbon black is not good enough after the thermal laminating process. Besides, the joint of conductive crystallized polymeric composite material filled with carbon black and metal foil is formed by use of the heating resin, which inside the conductive crystallized polymeric composite material filled with carbon black, flows. Thus, the metal electrodes surface of metal laminated material as well as vacancy among the conductive carbon particles of conductive polymeric composite material are filled with carbon black. However, the carbon black cannot fully contact with the metal electrodes of the metal laminated plaque, and thus the interfacial resistance between metal laminated plaque and the conductive crystallized polymeric composite material plaque filled with carbon black rises. Moreover, when a laminated structure of the multi-layer circuit is used to fabricate an over-current protection device or a temperature switch device, it has to face various kinds of regular or irregular temperature variation. This leads to problems of joints between the electrodes of the metal laminated plaque and the conductive crystallized polymeric composite material plaque filled with carbon black.

To solve the problems of joint strength and interfacial resistance, U.S. Pat. Nos. 4,689,475 and 4,800,253 utilize electroplating for forming a rough surface with metal nodular protrusions on the surface of metal foil to increase the joint strength of the metal electrodes and the conductive crystallized polymeric composite material plaque filled with the carbon black.

However, the techniques disclosed by theses patents use the carbon black to be directly wedged to metal nodular protrusions, and the geometric shapes of the carbon black and of metal nodular protrusions are different, so the contact density is not very well. Meanwhile, mobility of resin on the surface of carbon black is not good between carbon black and metal, the resin can just be adhered to the surface of the metal and thus, increase the interfacial resistance and effect its function.

Furthermore, a known fabrication method of a thermistor is to make the conductive crystallized polymeric composite material filled with carbon black adhere to a foil, such as a copper foil or nickel foil. The method is subjected to the foil material to proceed with a continuous electroplating process for a whole roll of foil, so that the fabrication method is limited.

SUMMARY OF THE INVENTION

An object of the present invention is to provide a structure for composite materials of a positive temperature coefficient thermistor device and a method of making the same for forming a fine joint between metal electrodes and the polymeric composite material plaque having carbon black.

Another object of the present invention is to provide a structure for composite materials of a positive temperature coefficient thermistor device and a method of making the same for lowering down the interfacial resistance between metal electrodes and the polymeric composite material plaque having the carbon black.

Yet another object of the present invention is to provide a structure for composite materials of a positive temperature coefficient thermistor device and a method of making the same, which can fit into the well-developed printed circuit board process and utilize the plaque fabrication method. Thus the process can be simpler.

To achieve the objects described above and other effects, the present invention provides a structure for composite materials of a positive temperature coefficient thermistor device and a method of making the same. The method comprises the step of providing a metal laminated material with metal layers on its top and bottom surfaces and an insulating layer as its middle layer, and a conducting through hole between the top metal layer and the bottom metal layer is provided for conducting. Then the carbon black is electroplated onto the surface of the top metal layer. Because of the electroplated carbon black, a continuous porous structure is formed. Moreover, a conductive crystallized polymeric composite material filled with the carbon black is hot laminated with the surface of the top metal layer having the continuous porous structure to form a structure for composite materials of a positive temperature coefficient thermistor device.

Because of the composite electroplating, the surface of porous structure of the top metal layer contains the carbon black already. When a hot laminating process is performed, the carbon black of the porous structure of the top metal layer can be tightly integrated with the conductive polymeric composite material having the carbon black to form a fine joint.

Moreover, because the tight integration of the carbon black of the porous structure of the top metal layer with the conductive polymeric composite material, the interfacial resistance between the metal electrodes and the conductive polymeric composite material is effectively lowered down.

Furthermore, because existing printed circuit boards can be used as the metal laminated material of the present invention, the well-developed printed circuit board process can be used directly in the process of the thermistor device. Manufacturing the thermistor device by means of the plaque fabrication method of the printed circuit board process is simpler than the presently used continuous electroplating process for the whole roll of soft foil, and the process can be greatly simplified accordingly.

The present invention also provides a composite material laminated structure. The composite material laminated structure comprises a first metal layer; an insulating layer disposed on the first metal layer; and a second metal layer which is further disposed on the insulating layer. In the structure, one side of the second metal layer is a porous structure having a secondary aggregate of carbon black; wherein a conducting through hole is disposed between the second metal layer and the first metal layer through the insulating layer, the conducting through hole is used for electrical conduction between the first metal layer and the second metal layer. Moreover, a conductive crystallized polymeric composite material layer filled with carbon black is disposed on the second metal layer having a porous structure.

The present invention further provides a method for manufacturing a composite material laminated structure having a metal layer, the method first provides a metal laminated material having an insulating layer disposed at its bottom, and then electroplating a carbon black onto a surface of a metal layer of the metal laminated material by a composite electroplating process to form a continuous porous structure on the surface of the metal layer. After the continuous porous structure is formed, thermal-laminating a conductive crystallized polymeric composite material filled with carbon black with the surface of the metal layer having the continuous porous structure, thus a composite material laminated structure having a metal layer is formed.

Still another model provided by the present invention is a structure for composite materials of positive temperature coefficient thermistor device, the structure comprises an insulating layer; a first metal layer disposed on the insulating layer; a first composite material layer further disposed on the first metal layer, and a second composite material layer. The first composite material layer is taken as a metal basis having a secondary aggregate of carbon black which has a metal on its surface. A second composite material layer is disposed on the first composite material layer, the second composite material layer being comprised of the conductive crystallized polymeric composite material layer filled with carbon black.

In addition to the structure described above, the structure of the model further comprises a second metal layer disposed below the insulating layer. The materials of the metal layer, the insulating layer, and the second metal layer are all two-sided foil substrate, and a conducting through hole is disposed between the metal layer and the second metal layer as the electrical conduction between the metal layer and the second metal layer.

BRIEF DESCRIPTION OF THE DRAWINGS

The present invention is described below by way of examples with reference to the accompanying drawings which will make readers easily understand the purpose, technical contents, characteristics and achievement of the present invention, wherein.

DETAILED DESCRIPTION OF THE INVENTION

Figure 1:
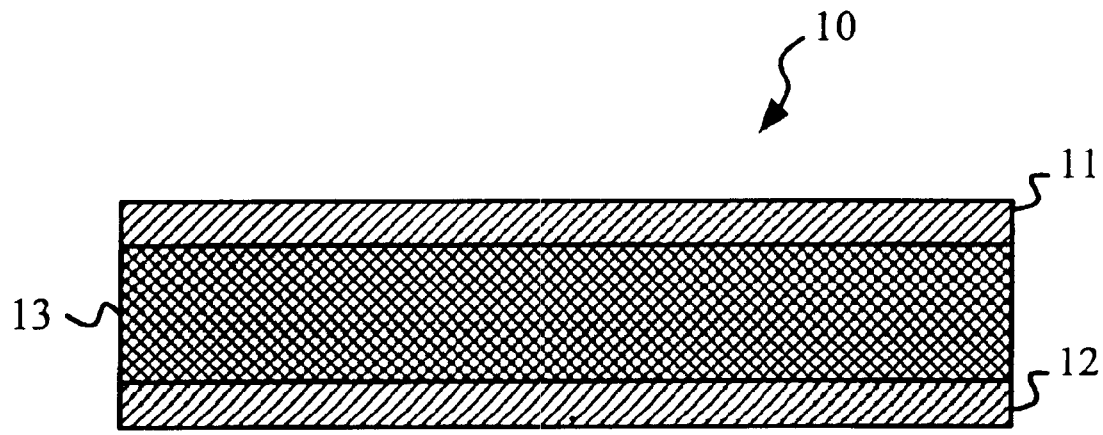
FIG. 1 is a cross-sectional view of a metal laminated material according to an embodiment of the present invention.
Figure 2:
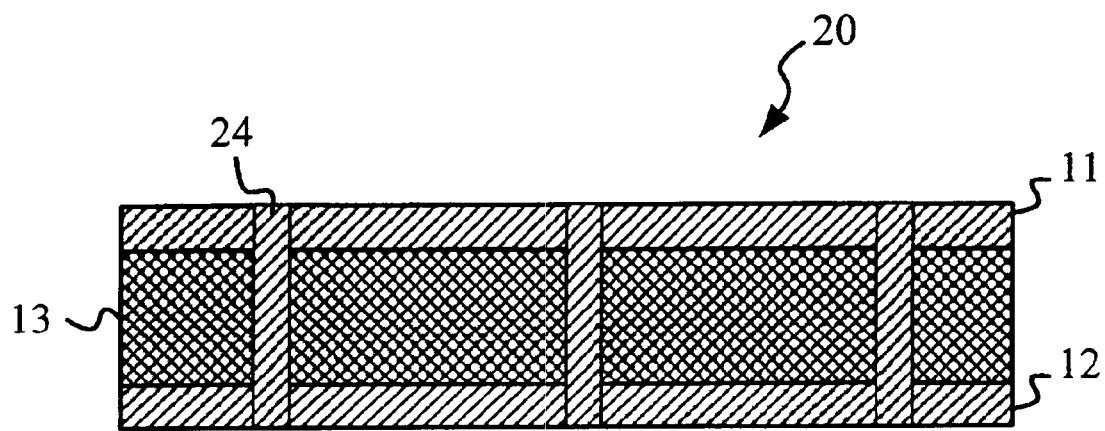
FIG. 2 is a cross-sectional view of the metal laminated material (after processed by a plate-through-hole process) according to the embodiment of the present invention.

Referring to FIG. 1, a cross-sectional view of a metal laminated material 10 of an embodiment of the present invention is shown. An existing printed circuit board can be used here. A bottom metal layer 12 (a first electrode) and a top metal layer 11 (a second electrode) of the metal laminated material 10 are copper foil (other materials such as nickel foil, platinum, copper alloy, nickel alloy, platinum alloy, or other conductive materials can be used as well) with a thickness of 18 $\mu$m. The insulating layer 13 can be a laminated material layer made of an epoxy resin layer, a polyimide resin layer, a glass fiber cloth impregnated with the epoxy resin, or a laminated material layer made of glass fiber cloth impregnated with a polyimide. The metal laminated material 10 with a size of 20 cm×20 cm is processed by a printed circuit board process to form a plurality of plate through holes 24 with a diameter of 0.05 cm and a pitch of 1 cm as shown in FIG. 2, so that the top metal layer 11 and the bottom metal layer 12 of a metal laminated material 20 are conducted to each other.

Figure 3:
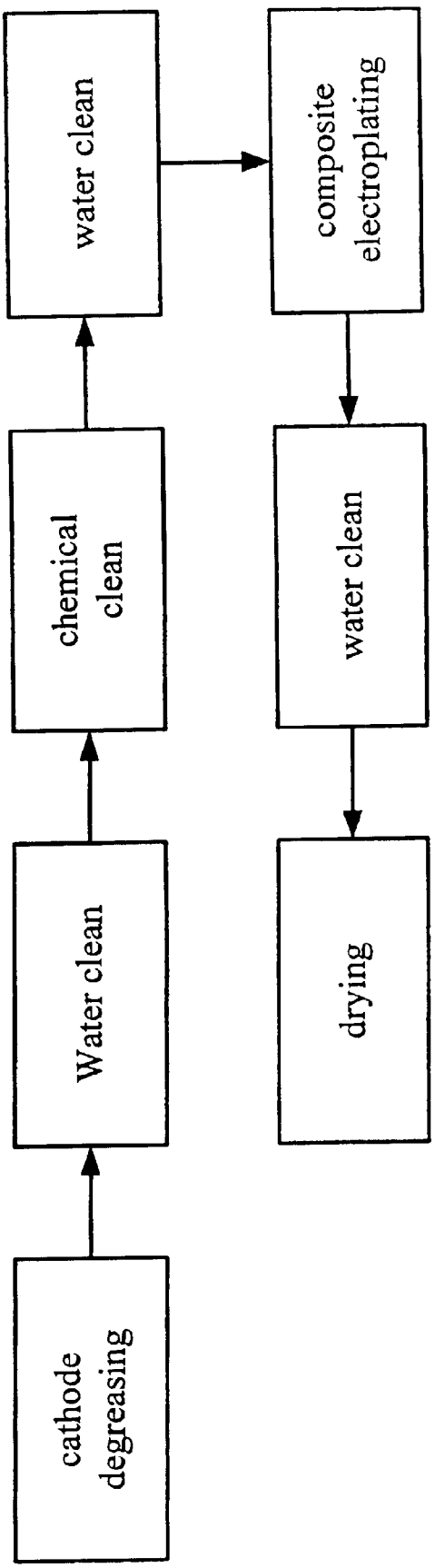
FIG. 3 is a flow chart of a composite electroplating process performed to the metal laminated material according to the embodiment of the present invention.

The metal laminated material 20 then undergoes a producing method as shown in FIG. 3 to composite electroplate the top metal layer 11, wherein 40 grams boric acid, 6 grams of carbon black XC-72 (a product of Cabot Co. of U.S.), and 30 grams of nickel (weight of nickel in a nickel sulphamate solution) in 1 liter of electroplating solution. The temperature for the process is 35° C., current density is 3A/dm$^2$, and electroplating time is 10 minutes. Among which, the degreasing solvent used in a cathode degreasing step is made by adding 60 grams of degreasing agent to 1 liter of deionized water, and the concentration of sulfuric acid used for acid rinse is 10%.

Figure 4:
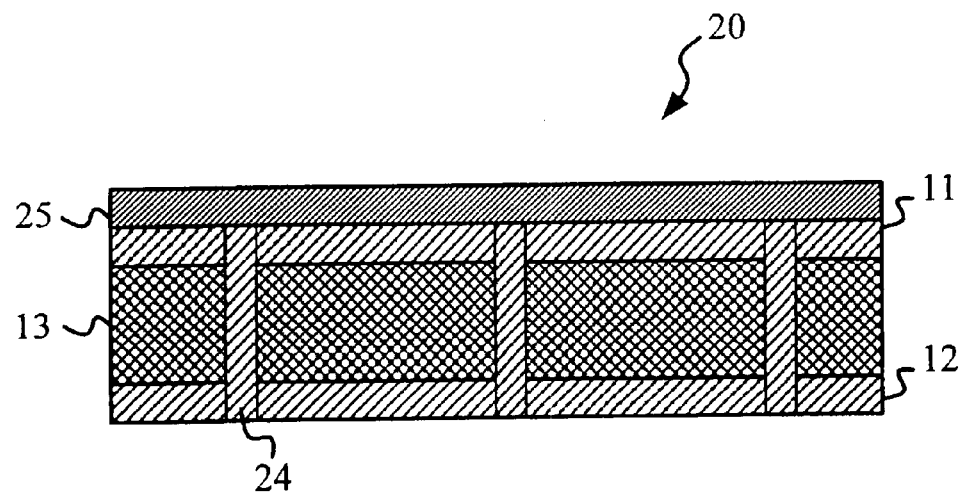
FIG. 4 is a cross-sectional view of the metal laminated material (after processed by the composite electroplating) according to the embodiment of the present invention.
Figure 5:
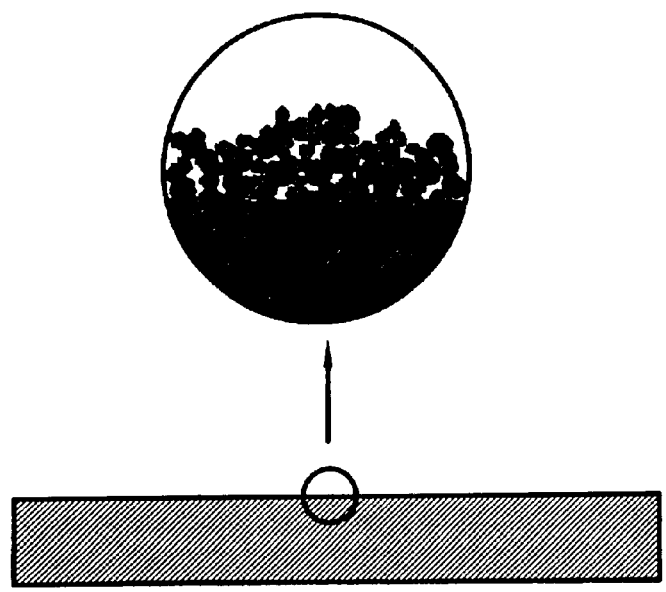
FIG. 5 is an enlarged diagram of a porous structure on the surface of the electroplated metal according to the embodiment of the present invention.

A metal laminated material 20 shown in FIG. 4 is obtained after electroplating. The electroplating process makes a continuous porous metallic composite material layer 25 having a carbon black and a metal (as shown in FIG. 5) formed on the surface of the top metal layer 11 of the metal laminated material, and its main constituents are a electroplated metal, a primary and a secondary aggregates of carbon black, while the electroplated metal adheres to the surface of the primary aggregate and the secondary aggregate of the carbon black to form a porous structure. In this embodiment, the thickness of an electroplated layer (metallic composite material layer) after composite electroplating is about 17 $\mu$m to 25 $\mu$m.

Figure 6:
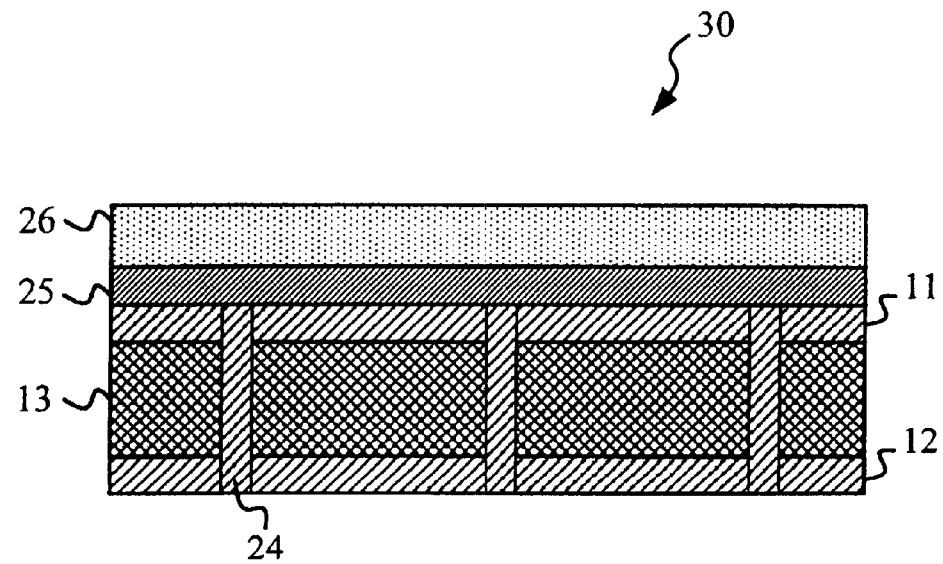
FIG. 6 is a cross-sectional view of the metal laminated material, which is hot laminated with a conductive polymeric composite material plaque having carbon black, according to the embodiment of the present invention.
Figure 9:
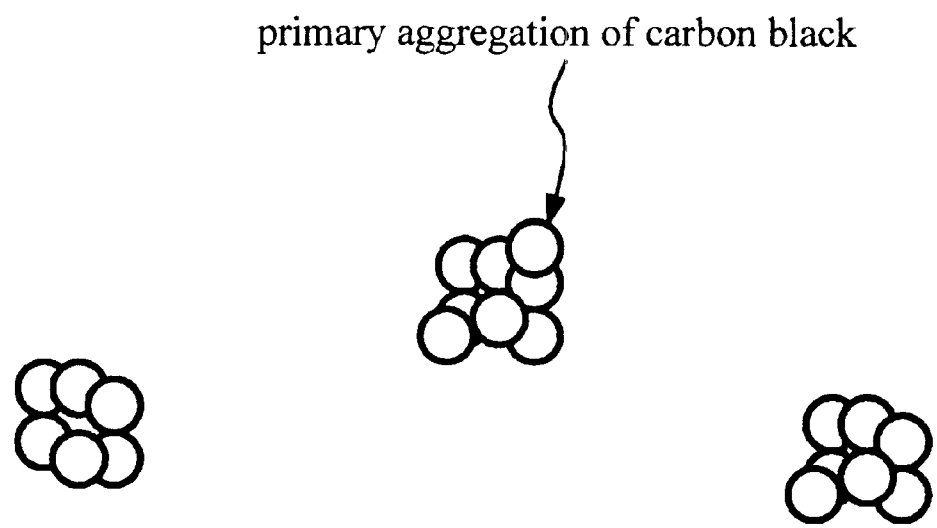
FIG. 9 is a diagram showing the primary aggregation of carbon black of the embodiment of the present invention.
Figure 10:
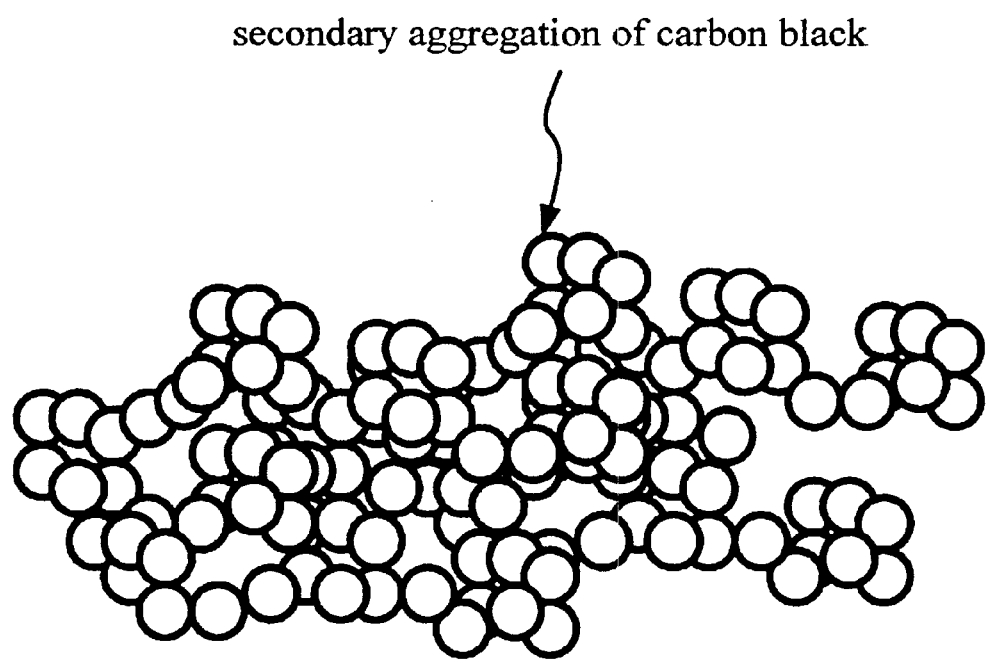
FIG. 10 is a diagram showing the secondary aggregation of carbon black of the embodiment of the present invention.
Figure 11:
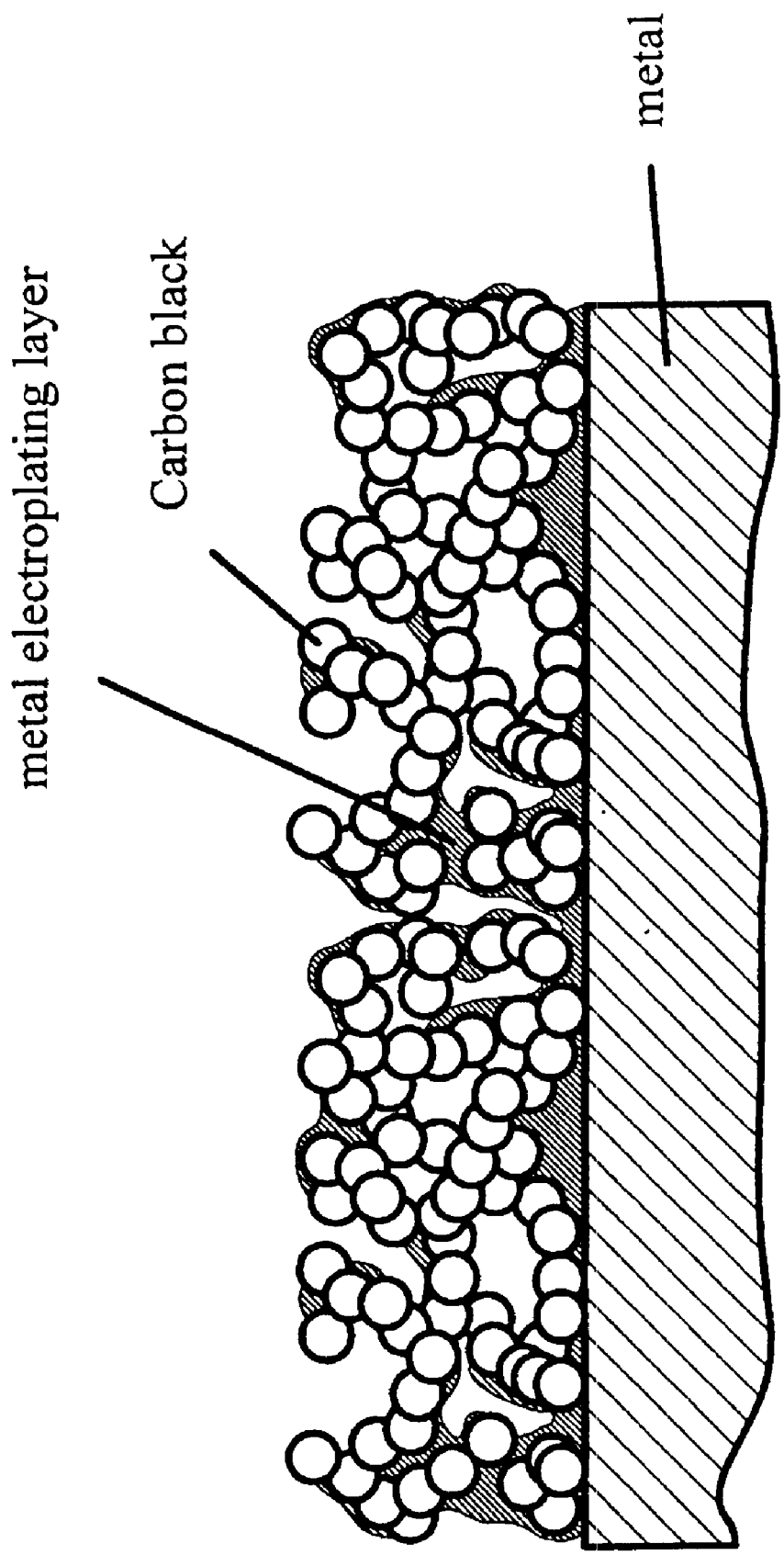
FIG. 11 is a cross-sectional view of the composite electroplating layer of a continuous porous carbon black with a metal.

Referring to FIG. 6, a conductive crystallized polymeric composite material 26 filled with carbon black is hot-laminated with the metal laminated material 20. The polymeric composite material of the conductive crystallized polymeric composite material filled with carbon black can be polyethylene, polypropylene, polyvinyl fluoride, or copolymers thereof. In the embodiment, the polymeric composite material is made of mixing polyethylene Petrothene LB832 (a product of Equistar Co. of U.S.) and carbon black Raven450 (a product of Columbian Co. of U.S.) at a weight ratio of 1:1 together, and then was incorporated into the Brabender mixer and mixed at 210° C. for 8 minutes. Then it was thermal-laminated with the metal laminated material 20 to form a plaque-shaped conductive composite material 30 having PTC characteristics with the thickness of 1 mm by a heated press at 175° C. The composite electroplating process makes the carbon black be electroplated to the surface of the metal layer 11 of the metal laminated material to form a continuous porous structure layer 25; moreover, both the surface of the top metal layer 11 and the conductive crystallized polymeric composite material 26 filled with carbon black contain carbon black. The carbon black in the continuous porous structure layer 25 on the surface of the top metal layer 11 and the conductive crystallized polymeric composite material 26 filled with carbon black exist in a basic form of primary aggregate (as shown in FIG. 9) and stack on each other in the resin substrate. When the quantity of carbon black is large, the primary aggregate of the carbon black will stack on each other to form secondary aggregate (as shown in FIG. 10) and becomes a conductive continuous phase in the composite material. The continuous porous structure layer 25 is constituted by metal, the primary aggregate of carbon black, and the secondary aggregate of carbon black. Because of the composite electroplating process, metal adheres to the surface of the secondary aggregate of the carbon black as shown in FIG. 11.

Moreover, the continuous porous structure layer 25 further forms the secondary aggregate with the conductive crystallized polymeric composite material 26 filled with the carbon black. The size of the primary aggregate of carbon black varies with different kinds of carbon black, the average is between 0.1 $\mu$m to 0.5 $\mu$m.

From micro-phenomenon point of view, the rough surface of the continuous porous structure layer 25 on the surface of the top metal layer 11 is similar to the microstructure of the carbon black conductive continuous phase in the conductive crystallized polymeric composite material 26 filled with carbon black, so that the continuous porous structure layer 25 on the surface of the top metal layer 11 and the carbon black conductive continuous phase of the conductive crystallized polymeric composite material 26 filled with carbon black form a fine joint. Furthermore, the resin substrate that adheres to the surface of the carbon black in the conductive crystallized polymeric composite material 26 filled with carbon black flows due to the heat during thermal laminating process, and then permeates into the continuous porous structure layer 25 on the surface of the top metal layer 11. Therefore, it does not effect route for carbon black to conduct electricity in the conductive crystallized polymeric composite material 26 filled with carbon black and directly contact to the top metal layer 11. To make sure that conductive composite material of polyethylene forms a well jointing strength with the top metal layer 11, the thickness of the composite electroplated layer (continuous porous structure layer 25) had better be more than two times the size of average diameter of the primary aggregate of carbon black. That is to say, the thickness of the continuous porous structure layer 25 had better be more than 0.2 $\mu$m.

Figure 7:
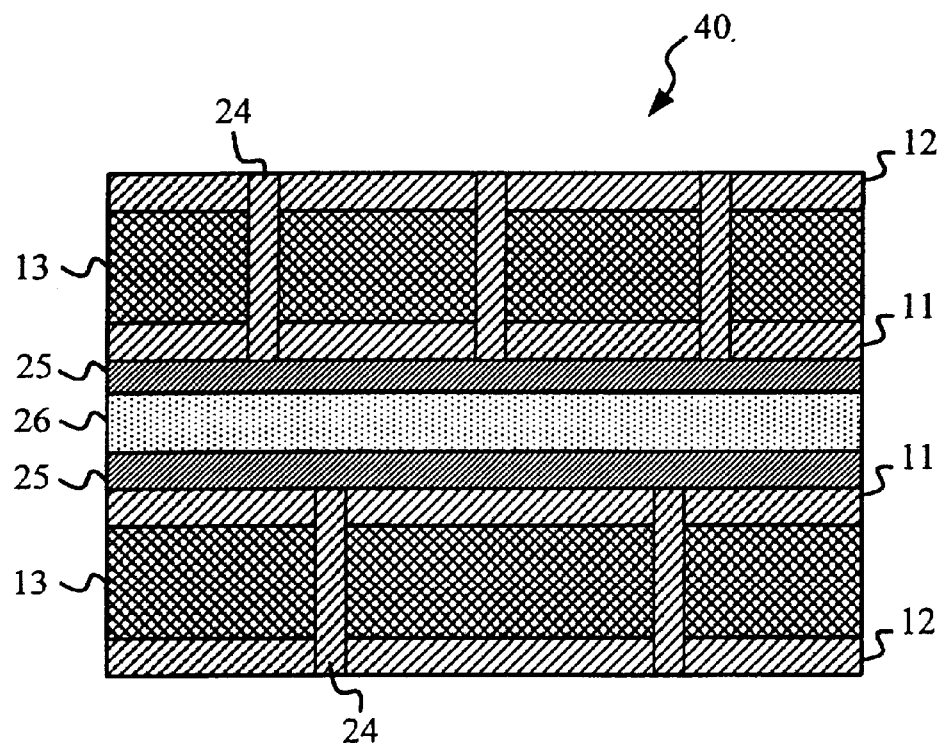
FIG. 7 is a cross-sectional view of an electrical characteristic testing sample of the positive temperature coefficient thermistor produced according to the embodiment of the present invention.

Referring to FIG. 7, two plaque-shaped conductive composite materials 30 facing each other with its side of conductive crystallized polymeric composite material 26 filled with carbon black are laminated by thermal laminating method at 175° C. for 10 minutes to form an electricity tested sample of a positive temperature coefficient thermistor device 40. Then, the sample is cut into specimens with a size of 2 cm×2 cm to be irradiated by Co-60 with a dosage of 20 Mrad.

Figure 8:
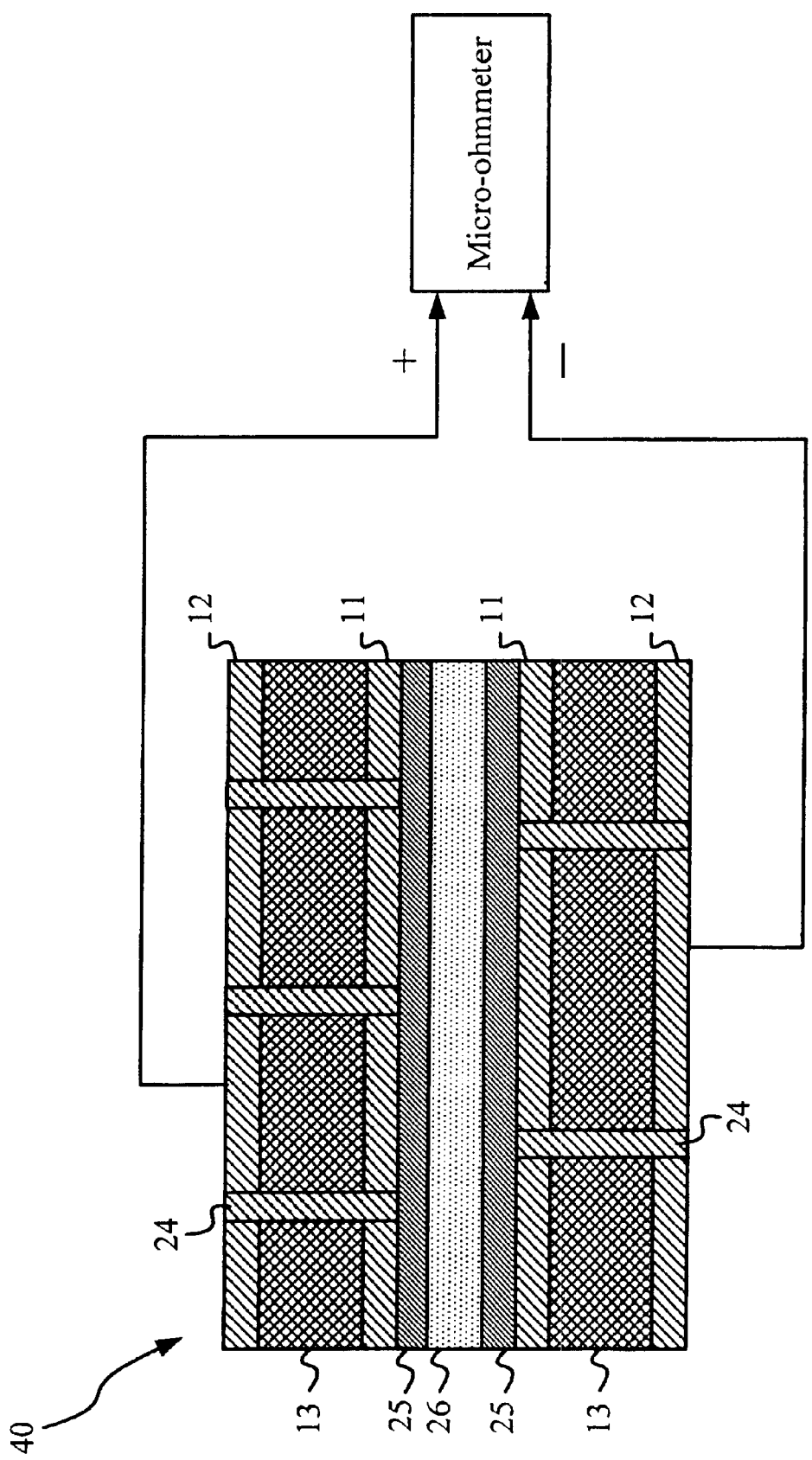
FIG. 8 is a diagram showing a resistance testing method according to the embodiment of the present invention.

Referring to FIG. 8, a resistance test is conducted with an micro-ohmmeter. A room temperature resistance R1 and a room temperature resistance R2 are measured for observing the room temperature resistance variation, wherein the specimen of R2 has been soaked in melted tin of 230° C. for 3 seconds first, and then is placed at the normal atmosphere temperature for 1 hour. From the comparison of R1 and R2, we can prove that the metal plate laminated material processed with carbon black composite electroplating and the conductive crystallized polymeric composite material filled with carbon black form a fine joint and have a lower interfacial resistance between them.

The prescriptions and the experimental conditions of the electroplated solution of the embodiment of the present invention, other embodiments, and the comparison embodiment are presented in table 1, and the thickness of the composite electroplated layers of the embodiments and the comparison embodiments after composite electroplating treatment are presented in table 2. The weights of each ingredient shown in table 1 represent the amount of ingredient added into 1 liter of electroplated solution. Weights of Nickel represent weights of Ni metal in Nickel Sulphamate solution. R1 in table 2 is the room temperature resistance of a specimen that is thermal-laminated with conductive crystallized polymeric composite material filled with carbon black without soaking in melted tin of 230° C. afterward. R2 is the room temperature resistance of the above specimen soaked in melted tin of 230° C. for 3 seconds first, and then is placed at the normal atmosphere temperature for 1 hour. The comparison reveals that the products of the present invention truly possess better joint and a lower interfacial resistance.

Moreover, the metal laminated material of the present invention can be a ready-made single-sided printed circuit board or a double-sided foil substrate, and thus the process of manufacturing the thermistor is easy to imitate the currently well-developed process of the printed circuit board. Manufacturing the thermistor by means of the plaque fabrication method of the printed circuit board process is simpler than currently used continuous electroplating process for the whole roll of soft foil, and thus the process can be greatly simplified accordingly.

The technical contents and features of the present invention are disclosed above. However, anyone that is familiar with the technique could possibly make modify or change the details in accordance with the present invention without departing from the technologic ideas and spirit of the invention. For example, changing the ingredients in the electroplated solution such as employing Watts Nickel, adding different kinds of carbon black, or changing composite electroplating conditions such as electroplated temperature, electroplated current, and electroplated time are within the protection scope of the present invention. The protection scope of the present invention shall not be limited to what embodiment discloses, it should include various modification and changes that are made without departing from the technologic ideas and spirit of the present invention, and should be covered by the claims mentioned below.

What is claimed is:

1. A composite material laminated structure having metal layers comprising:

a first metal layer;

an insulating layer disposed on the first metal layer;

a second metal layer disposed on the insulating layer, wherein one side of the second metal layer has porous structure having a secondary aggregate of carbon black, and a conducting through hole is disposed between the second metal layer and the first metal layer through the insulating layer for electrical conduction between the first metal layer and the second metal layer; and a conductive crystallized polymeric composite material layer filled with carbon black disposed on the second metal layer having a porous structure.

2. The structure according to claim 1, wherein the conductive crystallized polymeric composite material layer filled with carbon black is selected from the group consisting of polyethylene, polypropylene, polyvinyl fluoride, or copolymers thereof.

3. The structure according to claim 1, wherein the thickness of the porous structure having the secondary aggregate of carbon black is more than 0.2 $\mu$m.

4. The structure according to claim 1, wherein the insulating layer is selected form the group consisting of a first laminated material layer or a second laminated material layer made of an epoxy resin layer, a polyimide resin layer, a glass fiber cloth impregnated with the epoxy resin, and a glass fiber cloth impregnated with a polyimide.

5. The structure according to claim 1, wherein the second metal layer is selected from the group consisting of copper foil, nickel foil, platinum, copper alloy, nickel alloy, and platinum alloy.

6. A structure for composite materials of a positive temperature coefficient thermistor device comprising;

an insulating layer;

a first metal layer disposed on the insulating layer;

a first composite material layer disposed on the metal layer, wherein the first composite material layer is a metallic composite material layer and itself has a secondary aggregate of carbon black which has a metal on its surface; and a second composite material layer disposed on the first composite material layer, the second composite material layer being comprised of the conductive crystallized polymeric composite material layer filled with carbon black.

7. The structure for composite materials according to claim 6, wherein the insulating layer is a single or a multi-layer structure constituted by an epoxy resin layer, a polyimide resin layer, a glass fiber cloth impregnated with the epoxy resin, or a glass fiber cloth impregnated with a polyimide.

8. The structure for composite materials according to claim 6, wherein a second metal layer is disposed below the insulating layer.

9. The structure for composite materials according to claim 8, wherein the first metal layer, the insulating layer, and the second metal layer are made of double-sided metal foil substrate.

10. The structure for composite materials according to claim 9, wherein a plate through hole is disposed between the first metal and the second metal layer for conducting the first metal and the second metal layer to each other.

* * * * *